(12) United States Patent
Luchinger et al.

(10) Patent No.: US 10,326,058 B2
(45) Date of Patent: Jun. 18, 2019

(54) LUMINESCENT COMPONENT

(71) Applicant: AVANTAMA AG, Stafa (CH)

(72) Inventors: Norman Albert Luchinger, Meilen (CH); Ines Weber, Thalwil (CH); Stefan Loher, Zurich (CH); Marek Oszajca, Mannedorf (CH); Benjamin Hartmeier, Zurich (CH)

(73) Assignee: Avantama AG, Stäfa (CH)

( * ) Notice: Subject to any disclaimer, the term of this patent is extended or adjusted under 35 U.S.C. 154(b) by 0 days.

(21) Appl. No.: 15/544,625

(22) PCT Filed: May 25, 2016

(86) PCT No.: PCT/CH2016/000082
§ 371 (c)(1),
(2) Date: Jul. 19, 2017

(87) PCT Pub. No.: WO2017/106979
PCT Pub. Date: Jun. 29, 2017

(65) Prior Publication Data
US 2017/0369776 A1    Dec. 28, 2017

(30) Foreign Application Priority Data
Dec. 23, 2015 (EP) .................................... 15003666

(51) Int. Cl.
*H01L 33/50* (2010.01)
*G02F 1/1335* (2006.01)
(Continued)

(52) U.S. Cl.
CPC ............ *H01L 33/504* (2013.01); *C09K 11/02* (2013.01); *C09K 11/025* (2013.01);
(Continued)

(58) Field of Classification Search
CPC ............................ H01L 33/507; H01L 33/504
(Continued)

(56) References Cited

U.S. PATENT DOCUMENTS 5,736,069 A * 4/1998 Willems ............... C09K 11/628
                                                        250/363.01
2009/0173957 A1 7/2009 Brunner et al.
(Continued)

FOREIGN PATENT DOCUMENTS

KR    10-2012-0099704 A    9/2012
WO       2011/053635 A1    5/2011
(Continued)

OTHER PUBLICATIONS

International Search Report for corresponding International Application No. PCT/CH2016/000082 dated Aug. 18, 2016.
(Continued)

*Primary Examiner* — Igwe U Anya
(74) *Attorney, Agent, or Firm* — Renner, Otto, Boisselle & Sklar, LLP

(57) ABSTRACT

A luminescent component includes a first element comprising a first solid polymer composition, wherein the first solid polymer composition includes first luminescent crystals, wherein the first luminescent crystals are of the perovskite structure, and are selected from compounds of formula (I): $M^1_a M^2_b X_c$, wherein $M^1$ represents Cs, optionally doped with up to 30 mol % of one or more other metals having coordination number 12, $M^2$ represents Pb, optionally doped with up to 30 mol % of one or more other metals having coordination number 6, X independently represents anions selected from the group consisting of Cl, Br, I, cyanide, and thiocyanate. The first luminescent crystals are of size between 3 nm and 3000 nm, and emit light of a first wavelength in response to excitation by light with a wave-
(Continued)

length shorter than the first wavelength. An encapsulation including a polymer or an inorganic matrix encloses the first element.

23 Claims, 5 Drawing Sheets

(51) Int. Cl.
*H01L 33/52* (2010.01)
*F21K 9/64* (2016.01)
*F21V 9/30* (2018.01)
*C09K 11/02* (2006.01)
*C09K 11/66* (2006.01)
*G02F 1/13357* (2006.01)
*F21Y 115/10* (2016.01)

(52) U.S. Cl.
CPC .............. *C09K 11/665* (2013.01); *F21K 9/64* (2016.08); *F21V 9/30* (2018.02); *G02F 1/1336* (2013.01); *H01L 33/501* (2013.01); *H01L 33/507* (2013.01); *H01L 33/52* (2013.01); *F21Y 2115/10* (2016.08); *G02F 2001/133614* (2013.01); *H01L 2933/0041* (2013.01)

(58) Field of Classification Search
USPC .......................................................... 257/98
See application file for complete search history.

(56) References Cited

U.S. PATENT DOCUMENTS

| | | | |
|---|---|---|---|
| 2011/0068322 A1* | 3/2011 | Pickett | C09K 11/02 257/13 |
| 2011/0169045 A1* | 7/2011 | Oyamada | H01L 51/5076 257/102 |
| 2015/0047765 A1 | 2/2015 | Vo et al. | |
| 2015/0108521 A1 | 4/2015 | Hattori et al. | |
| 2015/0137163 A1* | 5/2015 | Harris | H01L 33/483 257/98 |
| 2016/0369975 A1* | 12/2016 | Chen | C09K 11/883 |
| 2017/0096538 A1 | 4/2017 | Sasaki et al. | |

FOREIGN PATENT DOCUMENTS

| | | |
|---|---|---|
| WO | 2014/208356 A1 | 12/2014 |
| WO | 2015/141226 A1 | 9/2015 |

OTHER PUBLICATIONS

Written Opinion of the International Searching Authority for corresponding International Application No. PCT/CH2016/000082 dated Aug. 18, 2016.

Protesescu et al., "Nanocrystals of Cesium Lead Halide Perovskites ($CsPbX_3$, X = Cl, Br, and I): Novel Optoelectronic Materials Showing Bright Emission with Wide Color Gamut", Nano Letters, vol. 15, No. 6, Jun. 10, 2015, pp. 3692-3696.

* cited by examiner

LUMINESCENT COMPONENT

This application is a national phase of International Application No. PCT/CH2016/000082 filed May 25, 2016 and published in the English language, and claims priority to European Application No. 15003666.3 filed on Dec. 23, 2015.

TECHNICAL FIELD

The present invention relates to the field of luminescent crystals (LCs). The invention provides a luminescent component, a luminescent device, a use of a luminescent component, and a method for manufacturing a luminescent component.

BACKGROUND ART

WO 2011/053635 A1 shows light-emitting diode (LED) devices comprising compositions and containers of hermetically sealed luminescent nanocrystals.

DISCLOSURE OF THE INVENTION

According to an aspect of the present invention, a luminescent component is provided. The luminescent component comprises a first element including first luminescent crystals, which first element is enclosed by an encapsulation comprising one of a polymer or an inorganic matrix.

It is preferred that the first element does not spontaneously emit light of a wavelength but does so in response to an excitation, and in particular in response to an excitation with light of a wavelength shorter than the wavelength of the light to be emitted in response to the excitation. Hence, in a preferred embodiment, the first element emits light of a first wavelength, e.g. light in the red spectrum in response to an excitation with e.g. light in the blue spectrum.

For providing the subject light emitting properties, the first element comprises a first solid polymer composition including the first luminescent crystals for emitting light of the first wavelength in response to an excitation, and preferably including a first polymer, preferably in form of a matrix the first luminescent crystals are embedded in.

The term "matrix" is known in the field and in the context of this invention denotes continuous material encompassing a discontinuous or particulate phase.

Suitable luminescent crystals are of the perovskite structure. Such perovskite structures are known per se and described as cubic, pseudocubic, tetragonal or orthorhombic crystals of general formula $M^1M^2X_3$, where $M^1$ are cations of coordination number 12 (cuboctaeder) and $M^2$ are cations of coordination number 6 (octaeder) and X are anions in cubic, pseudocubic, tetragonal or orthorhombic positions of the lattice. In these structures, selected cations or anions may be replaced by other ions (stochastic or regularly), still maintaining its original crystalline structure. The manufacturing of such luminescent crystals is known, e.g. from Protesescu et al. (Nano Lett., 2015, 15, 3692-3696).

Advantageously, the first luminescent crystals are selected from compounds of formula (I):

$$M^1_a M^2_b X_c \qquad \text{(I), wherein}$$

$M^1$ represents Cs,
$M^2$ represents Pb,
X independently represents anions selected from the group consisting of Cl, Br, I, cyanide and thiocyanate,
a represents 1,
b represents 1,
c represents 3.

Independently means that X may be selected from one of the above named anions or may be a combination of more than one of the above anions. The term thiocyanate shall include both resonance structures, i.e. thiocyanate and isothiocyanate.

In embodiments of the invention, $M^1$ may be doped with up to 30 mol % of one or more other metals having coordination number 12 within the perovskite structure. Advantageously, $M^1$ is doped with up to 10 mol % of one or more of such metals. Suitable metals $M^1$ are selected from the group consisting of Rb, K, Na, and Li.

In embodiments of the invention, $M^2$ may be doped with up to 30 mol % of one or more other metals having coordination number 6 within the perovskite structure. Advantageously, $M^2$ is doped with up to 10 mol % of one or more of such metals. Suitable metals $M^2$ are selected from the group consisting of Ge, Sn, Sb and Bi.

In embodiments of the invention, X is selected from one of Cl, Br and I; or X represents independently two of Cl, Br and I; or X represents Cl, Br and I. The amount of Cl, Br, I, cyanide and thiocyanate may be determined by routine experiments such as mass spectrometry MS or x-ray fluorescence XRF, which are known in the field; the small Cl anion shifts the emission towards the blue, the large I anion towards the red and the medium sized Br anion towards the green part of the visible spectrum.

The first luminescent crystals are of size between 3 nm and 3000 nm, and in particular between 5 and 100 nm.

In a preferred embodiment, the first luminescent crystals are of formula (I-1)

$$CsPbI_xZ_{3-x} \qquad \text{(I-1), wherein}$$

$1 < x \leq 3$,

Cs, Pb is optionally doped with up to 30 mol % as described above,

Z represents one or more of Cl, Br.

Particularly advantageously, the first luminescent crystals are of formula $CsPbCl_yBr_{3-y-z}I_z$ where $0 < y < 1$, $2 \leq z \leq 3-y$ and/or of formula $CsPbBr_xI_{3-x}$, where $0 \leq x < 2$.

In these embodiments, the first wavelength of the light emitted has its peak in the red spectrum which is considered as light with a peak wavelength in the range between 590 nm and 700 nm, preferably with an FMWH between 15 and 50 nm. For both of the previous embodiments, the size of the first luminescent crystals is between 3 nm and 3000 nm, and in particular between 5 nm and 100 nm. In a different embodiment, the first luminescent crystals are of formula (I-2)

$$CsPbBr_xZ_{3-x} \qquad \text{(I-2), wherein}$$

$2 \leq x \leq 3$,

Cs, Pb is optionally doped with up to 30 mol % as described above,

Z represents one or more of Cl, I.

Particularly advantageously, the first luminescent crystals are of formula $CsPbCl_yBr_zI_{3-y-z}$, where $0 < y < 1$, $1 < z \leq 3-y$, and/or of formula $CsPbBr_xI_{3-x}$, where $2 \leq x \leq 3$.

In these embodiments, the first wavelength of the light emitted has its peak in the green spectrum which is considered as light with a peak wavelength in the range between 490 nm and 570 nm, preferably with an FMWH between 15 and 50 nm. For both of the previous embodiments, the size of the first luminescent crystals is between 3 nm and 3000 nm, and in particular between 5 nm and 100 nm.

In a preferred embodiment, the luminescent component comprises a second element including second luminescent crystals, which second element is enclosed by the encapsulation comprising the polymer or the inorganic matrix.

The second element emits light of a second wavelength that is different to the first wavelength. This is achieved by selecting a different chemical composition and/or a different size for the second luminescent crystals compared to the first luminescent crystals. For example, if the first luminescent crystals emit light in the red spectrum, the second luminescent crystals may be selected to emit light in the green spectrum. Again, it is preferred that the second element does not spontaneously emit light of the second wavelength but does so in response to an excitation, and in particular in response to an excitation with light of a wavelength shorter than the second wavelength and shorter than the first wavelength. The second luminescent crystals may be excited again by light in the blue spectrum, for example.

For providing the subject light emitting properties, the second element comprises a second solid polymer composition including the second luminescent crystals for emitting light of the second wavelength in response to the excitation, and preferably including a second polymer, preferably in form of a matrix the second luminescent crystals are embedded in.

Advantageously, the second luminescent crystals are selected from compounds of formula (II):

$$M^1_a M^2_b X_c \quad \text{(II), wherein}$$

M$^1$ represents Cs,
M$^2$ represents Pb,
X independently represents anions selected from the group consisting of Cl, Br, I, cyanide and thiocyanate,
a represents 1,
b represents 1,
c represents 3.

Independently means that X may be selected from one of the above named anions or may be a combination of more than one of the above anions. The term thiocyanate shall include both resonance structures, i.e. thiocyanate and isothiocyanate.

In embodiments of the invention, M$^1$ may be doped with up to 30 mol % of one or more other metals having coordination number 12 within the perovskite structure. Advantageously, M$^1$ is doped with up to 10 mol % of one or more of such metals. Suitable metals M$^1$ are selected from the group consisting of Rb, K, Na, and Li.

In embodiments of the invention, M$^2$ may be doped with up to 30 mol % of one or more other metals having coordination number 6 within the perovskite structure. Advantageously, M$^2$ is doped with up to 10 mol % of one or more of such metals. Suitable metals M$^2$ are selected from the group consisting of Ge, Sn, Sb and Bi.

In embodiments of the invention, X is selected from one of Cl, Br and I; or X represents independently two of Cl, Br and I; or X represents Cl, Br and I. The amount of Cl, Br, I, cyanide and thiocyanate may be determined by routine experiments; the small Cl anion shifts the emission towards the blue, the large I anion towards the red and the medium sized Br anion towards the green part of the visible spectrum.

The second luminescent crystals are of size between 3 nm and 3000 nm, and in particular between 5 and 100 nm.

In one embodiment, the first luminescent crystals are of formula (I-1), and the second luminescent crystals are of formula (I-2). In this scenario, the luminescent component emits red and green light. Of course, first luminescent crystals and second luminescent crystals can be selected to emit light of a different color than red and green, as long as the first luminescent crystals follow formula (I) and the second luminescent crystals follow formula (II).

However, one or more further kinds of luminescent crystals can be provided in one or more further elements for emitting light of colors different than defined by the first wavelength and the second wavelength. This is achieved by selecting a different chemical composition and/or a different size for the further luminescent crystals compared to the first, second, and other further luminescent crystals. In a preferred embodiment, N further elements are provided in the luminescent component, with N>=1, and preferably 3≤=N≤=28. Each further element comprises a further solid polymer composition, wherein each further solid polymer composition comprises further luminescent crystals, and a further polymer, preferably in form of a matrix the further luminescent crystals are embedded in.

Each of the further luminescent crystals is selected from compounds of formula (III):

$$M^1_a M^2_b X_c \quad \text{(III), wherein}$$

M$^1$ represents Cs,
M$^2$ represents Pb,
X independently represents anions selected from the group consisting of Cl, Br, I, cyanide and thiocyanate,
a represents 1,
b represents 1,
c represents 3.

Again, independently means that X may be selected from one of the above named anions or may be a combination of more than one of the above anions. The term thiocyanate shall include both resonance structures, i.e. thiocyanate and isothiocyanate.

In embodiments of the invention, M$^1$ may be doped with up to 30 mol % of one or more other metals having coordination number 12 within the perovskite structure. Advantageously, M$^1$ is doped with up to 10 mol % of one or more of such metals. Suitable metals M$^1$ are selected from the group consisting of Rb, K, Na, and Li.

In embodiments of the invention, M$^2$ may be doped with up to 30 mol % of one or more other metals having coordination number 6 within the perovskite structure. Advantageously, M$^2$ is doped with up to 10 mol % of one or more of such metals. Suitable metals M$^2$ are selected from the group consisting of Ge, Sn, Sb and Bi.

In embodiments of the invention, X is selected from one of Cl, Br and I; or X represents independently two of Cl, Br and I; or X represents Cl, Br and I. The amount of Cl, Br, I, cyanide and thiocyanate may be determined by routine experiments; the small Cl anion shifts the emission towards the blue, the large I anion towards the red and the medium sized Br anion towards the green part of the visible spectrum.

For providing the subject light emitting properties, each further element comprises a further solid polymer composition including the further luminescent crystals for emitting light of the further wavelength in response to an excitation, and preferably including a further polymer.

Each further luminescent crystals are of size between 3 nm and 3000 nm, and in particular between 5 and 100 nm.

Preferably, the light emitted by each further luminescent crystals is not only different in its wavelength from the first wavelength and the second wavelength but also is different of any of the N-1 other further wavelengths. By suitable designing of elements, the luminescent component may emit any wavelength combination of light.

In a preferred embodiment, the luminescent component comprises overall between 5 to 30 different elements comprising different luminescent crystals thus leading to a tunable emission spectrum of the luminescent component.

In the case of the luminescent component comprising a first element only but no second or further elements, not only a single first element may be provided in the luminescent component, but multiple first elements in order to enhance its luminosity. In the case of the luminescent component comprising first and second elements only but no further elements, multiple first elements and multiple second elements may be provided in the luminescent component in order to enhance its luminosity. In the case of the luminescent component comprising first, second and further elements, multiple first elements, multiple second elements and multiple further elements of each kind may be provided in the luminescent component in order to enhance its luminosity. It may be preferred that the multiple first elements and the multiple second elements and possible multiple further elements are arranged alternating or are arranged random in the encapsulation.

Accordingly, cesium lead halide nanocrystals and doped cesium lead halide nanocrystals, which are of the perovskite structure, are preferably used as first, second and further luminescent crystals. The emission of light with a specific wavelength depends on a selection of the material of the luminescent crystals within the above constraints, and depends on a size of the luminescent crystals.

Preferably, the first element comprises first luminescent crystals only and is free from any other luminescent crystals. In case of a second element, the second element in turn preferably comprises second luminescent crystals only and is free from any other luminescent crystals. This logic may also be applied to any further elements and the corresponding luminescent crystals. Hence, a further element preferably comprises further luminescent crystals only and is free from any other luminescent crystals. By these means, each element is dedicated to solely emitting light in the assigned peak wavelength, and no light of a different color. This concept may hold for any first element in case of multiple first elements, and for any second element in case of multiple second elements, etc.

It is preferred, that a mean diameter of the first elements—and of the second elements and of the further elements if any—is between 1 µm and 500 µm, preferably between 5 µm and 100 µm.

Preferably, the encapsulation fully encloses the first element, and in case of multiple first elements, encapsulates all first elements. However, in a different scenario in case of multiple first elements, one or more of these first elements may reside at an outer surface of the encapsulation such that for those first elements the encapsulation is a partial encapsulation instead of a full encapsulation. However, even in these instances, there is at least one other first element fully enclosed by the encapsulation. This concept is also applicable to second or further elements, if any.

In a preferred embodiment, the encapsulation in case of a polymer is a polymer selected from the list of acrylate polymers, carbonate polymers, sulfone polymers, epoxy polymers, vinyl polymers, urethane polymers, ester polymers, styrene polymers, silicone polymers, olefin polymers and cyclic olefin copolymers, preferably silicones, cyclic olefin copolymers and halogenated vinyl polymers, most preferably epoxy polymers and acrylate polymers or co-polymers or mixtures thereof, most preferably having a water vapor transmission rate of less than $0.2$ g mm m$^{-2}$ day$^{-1}$ at a temperature of 20-50° C./90% relative humidity and atmospheric pressure.

In another embodiment, the encapsulation is an inorganic matrix. The inorganic matrix preferably is obtained from a liquid precursor which forms an inorganic matrix upon thermal decomposition or reaction with humidity/water. Such precursors include one or more of metal alkoxides (such as alkoxy-silanes), metal hydroxides (such as hydroxy-silanes), liquid silicates (such as sodium silicates, potassium silicates and lithium silicates).

Preferably, each of the first, the second if present, and the Nth polymer if present is independently selected from the group of polyacrylates (and co-polymers), polystyrenes, silicones, and cyclic olefin copolymers, preferably cyclic olefin copolymers. Preferably, the first polymer, the second polymer if present, and any further polymer if present are the same polymers.

In another embodiment each of the first, the second if present, and the Nth polymer if present is independently selected from a crosslinked polymer.

It is preferred that the encapsulation and the first polymer of the first element do not dissolve with each other when in contact, at least when in contact in the solid phase. By selecting the respective polymer materials appropriately, the first luminescent crystals are confined in the first element and cannot interact with second or further luminescent crystals outside the first element, e.g. in a second or further element.

In case of a second or further element, this second or further element preferably is separated from the first element by the encapsulation. The first and the second and the further element if present are arranged spaced in the encapsulation. Hence, any gap between elements is filled by the material of the encapsulation, such as a solid encapsulation polymer or an inorganic matrix. It is preferred that the encapsulation and the second polymer of the second element, and any further polymer of any further element do not dissolve with each other when in contact, at least when in contact in the solid phase.

Preferably, the encapsulation, and preferably also each of the first, second or further polymer if present is transmissive for light in the visible spectrum, i.e. is non-opaque.

In a preferred embodiment, the encapsulation may take the shape of a film or layer, i.e. with a length and width exceeding a thickness of the encapsulation, and preferably exceeding the thickness at least ten times.

Generally, one or more barrier films may be provided, preferably each barrier film having a water vapor transmission rate of less than $0.2$ (g*mm)/(m^2*day) at a temperature of 20-50° C./90% relative humidity and atmospheric pressure. In any of the above and below embodiments, the component may include a barrier film on top of an otherwise exposed surface of the luminescent component. Such barrier film may in particular have a low water vapour transmission rate in order to avoid a degradation of the LCs in the component in response to being exposed to water. The barrier film may in one embodiment be permeable for $O_2$, or, in a different embodiment, may also be impermeable for oxygen. Preferably, the barrier film is transmissive for light, and preferably, such barrier film may be present in the form of a single layer or in the form of multilayers. The barrier film comprises organic polymers and/or inorganic materials. Suitable organic polymers may be selected from the group consisting of polyvinylidene chlorides (PVdC), cyclic olefin copolymer (COC), high-density polyethylene (HDPE); suitable inorganic materials may be selected from the group consisting of metal oxides, $SiO_x$, $Si_xN_y$. Most preferably, a polymer barrier film comprises materials selected from the group of PVdC and COC. In a preferred embodiment, barrier films may be attached to both sides of the encapsulation in case of a rectangular, sheet-like luminescent component.

The present luminescent component provides for a spatial separation of the first and any other second or further luminescent crystals. As will be shown in more detail below, the separation is achieved by embedding the one or more first elements in the encapsulation. Hence, the first luminescent crystals are arranged in the dedicated one or more first elements only, while any second or further luminescent crystals are provided in associate elements only. By doing so an exchange of cations and anions between the first luminescent crystals on the one hand and any second or further luminescent crystals on the other hand is avoided. Given that the fabrication of the each of the different elements preferably is performed in a suspension, a mixing of first luminescent crystals and second or further luminescent crystals in a common suspension is avoided. Such mixing in a common suspension instead would result in a conversion of the origin first, second or further luminescent crystals into different luminescent crystals by way of reaction/recombination based on the above mentioned ion exchange. As a result, such different luminescent crystals would possibly emit light of a different wavelength than the first, second or further luminescent crystals on their own. Hence, luminescent crystals of different kind are separated at the stage of manufacturing, and hence are added to different portions of the suspension resulting in the above first, second or further elements after hardening/curing/drying.

Each portion of the suspension preferably comprises the assigned luminescent crystals, a solvent, a ligand, and a polymer. Given that the resulting elements are solid elements, an interaction of the first luminescent crystals in the first element with any second luminescent crystals in a second element is avoided.

The present component provides an excellent photoluminescence quantum yield.

The term "quantum yield (QY)" is known in the field and relates to the amount of times a specific event occurs per photon that is absorbed in the system. In the context of the present invention the term "quantum yield" refers to the "photoluminescence quantum yield" of the described substance and both terms are used with identical meaning. The "photoluminescence quantum yield" defines how many photons of a longer wavelength (lower energy) are emitted by the described system per photon that is absorbed by the system.

For example, the quantum yield of the solid polymer compositions suggested to be used in the present one or more elements is in total>60%, and preferably >80%, most preferably >90%, preferably when excited by blue light. In addition, owed to the material selection, the crystal size, and the strict separation of LCs of different colors, sharp wavelength distributions can be achieved in the emitted light, such that the quality of the resulting emitted light is superior. Preferably, the FWHM (Full Width at Half Maximum) of the solid polymer composition of each of the elements for visible emissions is <50 nm, preferably, <40 nm, and most preferably <30 nm. For example, an FWMH for the emission peak at 507 nm of 22 nm can be observed, at the same time measuring a high luminescence quantum yield of e.g. 76%.

Embodiments of the present component comply with RoHS ("Restriction of Hazardous Substances") Directive by the European Union. At the time of filing the present patent application the applicable directive 2011/65/EU generally restricted the use of the following elements: Lead (Pb)<1000 ppm by weight, Mercury (Hg)<1000 ppm, Cadmium (Cd)<100 ppm, Hexavalent chromium (Cr6+)<1000 ppm, Polybrominated biphenyls (PBB)<1000 ppm, Polybrominated diphenyl ether (PBDE)<1000 ppm.

On the one hand, this is achieved by selecting Cd-free material, which still provides excellent quantum yield/performance. The limit for Pb according to the RoHS Directive Version 2 (2011/65/EU) is less than 1000 ppm, which is achieved in total for the component as such. Preferably, the total Pb concentration for the components of the present embodiments is below 1000 ppm, more preferably between 30 ppm and less than 1000 ppm, and most preferably between 100 ppm and 900 ppm. The RoHS compliance may be achieved by selecting an appropriate concentration of the first and possibly second or further luminescent crystals respectively, and preferably by selecting an appropriate concentration of elements in the component. The subject concentration can be measured by MS or XRF measurements.

Preferably, a concentration of the respective luminescent crystals with respect to a polymer matrix representing the solid polymer composition of the first element in case of red light emission is between 0.01 wt % and 10.0 wt %, preferably between 0.10 wt % and 7.6 wt %, most preferably between 0.2 wt % and 1.0 wt %; and for a second element if any in case of green light emission preferably between 0.01 wt % and 8.0 wt %, preferably between 0.10 wt % and 6.2 wt %, most preferably between 0.2 wt % and 1.0 wt %. The upper limit of this concentration range supports RoHS compliance under the condition that the luminescent component comprises 90 wt % encapsulant (3), while the lower limit of this concentration range provides for a sufficient emission at reasonable component thickness under the condition that the the luminescent component comprises 50 wt % encapsulant (3).

A concurrent high quantum yield, RoHS compliance, a stable peak position and narrow FWHM in the emitted spectrum, and a high stability represents a major achievement of the present invention over the art. Conventionally, CdSe or InP materials were suggested for LCs. However, while the first provides a sufficient quantum yield, RoHS compliance is challenging and often relies on regulatory exemptions. The latter on the other hand is RoHS compliant but shows inferior optical qualities (quantum yield<60%; FWHM>40 nm). In contrast, the component of the present invention provides both, a good quantum yield, low peak FWHM and RoHS conformity. This is achieved by selecting appropriate materials for LCs, applying appropriate LC concentrations in the elements, applying an appropriate concentration of elements in the component and by selecting appropriate component dimensions/thicknesses and at the same time arranging the different LCs in different elements, as a result separating the LCs from each other to avoid ion exchange reactions.

As to further specifying optical properties, it is preferred that the component has a haze between 10 and 90%. A haze may be introduced by scattering particles with RT>2.0 and size of 100-1000 nm, or by microstructures or microcrystalline polymer structures or by the elements itself.

The luminescent component preferably is an intermediate good that is assembled together with other components into a device, such as an optical device, and preferably into one of a Liquid Crystal Display (LCD), a Light Emitting Diode (LED), an Organic Light Emitting Diode (OLED), an OLED display, or a solar cell. As part of an OLED, LED or LCD, the component may contribute to a display of a mobile or stationary computing, telecommunication, or television device.

Accordingly, a light emitting device comprises a luminescent component according to any of the preceding embodiments and a light source for emitting blue light. Blue light is considered to have a wavelength in a range between 400 and 490 nm. The light source is arranged for exciting the luminescent component. Accordingly, the device is prepared to emit light of wavelengths which are defined by the luminescent crystals of the one or more different elements enclosed in the encapsulation of the luminescent component.

Preferably, the light source is an LED chip. In one embodiment, the luminescent component preferably is arranged to at least partly enclose the LED chip. In another embodiment, the luminescent component preferably is arranged distant from the LED chip. In such embodiment, the LED chip preferably is at least partly covered by a phosphor-free encapsulation.

The term "phosphor" is known in the field and denotes a substance showing the phenomenon of luminescence. This can either be phosphorescence or fluorescence. These materials are often used in solid state lighting applications where blue LED light is transformed into a white light by adding the right amount and type of phosphors such as doped yttrium aluminum oxides.

In yet another embodiment of this invention the light source is an OLED stack. In this case, the luminescent component is preferably arranged to cover the whole OLED stack or at least parts of it.

According to another aspect of the present invention, luminescent component of any of the preceding embodiments is used for emitting white light in response to the luminescent component being radiated by blue light, in particular as a backlight in a liquid crystal display. For this purpose, a blue light source may be provided in the device for exciting luminescent reactions in the luminescent component. In case the luminescent component comprises first elements emitting red light and second elements emitting green light, together with the blue light emission of the light source, the luminescent component emits white light resulting as a combination of the emission of red and green light in response to an excitation of the luminescent crystals in the first and second element respectively, and from the transmission of the blue light stemming from the light source which blue light is also used to excite the first and the second element. An intensity proportion of the red, green and blue light emitted preferably is in the range of a 1/3 each.

According to a further aspect of the present invention, a method is provided for generating a luminescent component according to any of the preceding embodiments. A first polymer solution is provided comprising the first luminescent crystals. In one alternative, multiple first elements are extracted from the first polymer solution by one of spray-drying, or precipitation. Or, in a different alternative, the first polymer solution is hardened or dried into the first solid polymer composition, and the first solid polymer composition is crushed resulting in multiple first elements. Then, the first elements are mixed into a solution including the encapsulation polymer and/or a liquid monomer and/or a liquid oligomer or precursor for an inorganic matrix. The luminescent component is provided by hardening and/or drying the encapsulation polymer. In case of different elements to be enclosed in the encapsulation, such as one or more second or further elements, those elements may be prepared according to the first elements. Once the second or further elements are provided as individual components they can be added to the solution including the encapsulation polymer together with or subsequent to the first elements.

Luminescent crystals (LC) preferably are made from semiconductor materials. A luminescent crystal shall include a quantum dot, typically in the range of 3-12 nm and a nanocrystal of up to 100 nm and a luminescent crystal of up to 3 µm. Preferably, luminescent crystals are approximately isometric (such as spherical or cubic). Particles are considered approximately isometric, in case the aspect ratio (longest:shortest direction) of all 3 orthogonal dimensions is 1-2. LCs show, as the term indicates, luminescence or more specifically defined photoluminescence. In the context of the present invention a luminescent crystal typically is a single-crystalline particle spatially separated from other particles due to the presence of a surfactant. It is a semiconducting material which exhibits a direct bandgap (typically in the range 1.1-3.8 eV, more typically 1.4-3.5 eV, even more typically 1.7-3.2 eV). Upon excitation/illumination with electromagnetic radiation equal or higher than the bandgap, the valence band electron is excited to the conduction band leaving an electron hole in the valence band. The formed exciton (electron-electron hole pair) then radiatively recombines in the form of photoluminescence, with maximum intensity centered around the LC bandgap value and exhibiting photoluminescence quantum yield of at least 1%. In contact with external electron and electron hole sources LC could exhibit electroluminescence. In the context of the present invention LCs do not exhibit mechano-luminescence (e.g. piezoluminescence), chemiluminescence, electrochemiluminescence nor thermoluminescence.

A quantum dot (QD) particularly relates to a semiconductor nanocrystal, which has a diameter typically between 3-12 nm. In this range, the physical diameter of the QD is smaller than the bulk excitation Bohr radius, causing quantum confinement effect to predominate. As a result, the electronic states of the QD, and therefore the bandgap, are a function of the QD composition and physical size, i.e. the color of absorption/emission is linked with the QD size. The optical quality of the QDs sample is directly linked with their homogeneity (more monodisperse QDs will have smaller FWHM of the emission). When QD reach size bigger than the Bohr radius the quantum confinement effect is hindered and the sample may not be luminescent anymore as nonradiative pathways for exciton recombination may become dominant. Thus, QDs are a specific sub-group of nanocrystals, defined in particular by its size and size distribution. Properties of the QDs are directly linked with these parameters, distinguishing them from nanocrystals.

Each of the first, second or further solid polymer compositions if any preferably comprises, in addition to the luminescent crystals of the respective type, a hardened/cured polymer, including an organic and/or an inorganic synthetic material. Preferably, each of the first, the second if any, and the further polymer if any is independently selected from the group of polyacrylates (and co-polymers), polystyrenes, silicones, and cyclic olefin copolymers.

The hardened/cured polymer preferably is light transmissive, i.e. non-opaque for allowing light emitted by the luminescent crystals, and possible light of a light source used for exciting the luminescent crystals to pass.

Preferably, and in addition to the hardened/cured polymer and the luminescent crystals of the respective type, one or more of the first, second, and further polymer compositions comprises a surfactant selected from the group of non-ionic, anionic, cationic and zwitterionic surfactants; preferably selected from the group of amine or carboxy terminated surfactants.

The terms "surfactant", "ligand", "dispersant" and "dispersing agent" are known in the field and have essentially the same meaning. In the context of the present invention, these terms denote an organic substance, other than a solvent, which is used in suspensions or colloids to improve the separation of particles and to prevent agglomeration or settling. Without being bound to theory, it is believed that surfactants are physically or chemically attached on the particle surface either before or after adding the particles to the solvent and thereby provide the desired effects. The term surfactants includes polymer materials and small molecules; surfactants typically contain polar end-groups and apolar end-groups. In the context of the present invention, solvents (e.g. toluene) are not considered surfactants.

A "suspension" as used above in the aspect related to manufacturing is known and relates to a heterogeneous fluid of an internal phase (i.p.) that is a solid and an external phase (e.p.) that is a liquid. The external phase comprises one or more dispersants/surfactants, optionally one or more solvents and optionally one or more pre-polymers or dissolved polymers. Accordingly, each type of luminescent crystal (first, second) is added to the dedicated portion of suspension. Further processing includes the application of one or each portion of suspension to the desired area on the substrate. This step is also referred to as solution processing which denotes the application of a coating or thin element to a substrate by the use of a solution-based (=liquid) starting material. This is considered a significant advantage, as it enables manufacturing of all elements by simple technologies applicable to large areas and continuous processing.

Preferably, the first and second luminescent crystals each are embedded in a matrix such as a polymer matrix or an inorganic matrix, in order to spatially separate the first LCs from each other in the first element, and the second LCs from each other in the second element. The resulting "LC/QD composite" denotes a solid inorganic/organic composite material comprising LCs/QD, surfactant and a matrix and contributes to the respective first or second element.

Other advantageous embodiments are listed in the dependent claims as well as in the description below.

BRIEF DESCRIPTION OF THE DRAWINGS

Embodiments, examples, experiments representing or leading to embodiments, aspects and advantages of the invention will be better understood from the following detailed description thereof. Such description makes reference to the annexed drawings, wherein.

DETAILED DESCRIPTION OF THE DRAWINGS

Figure 1:
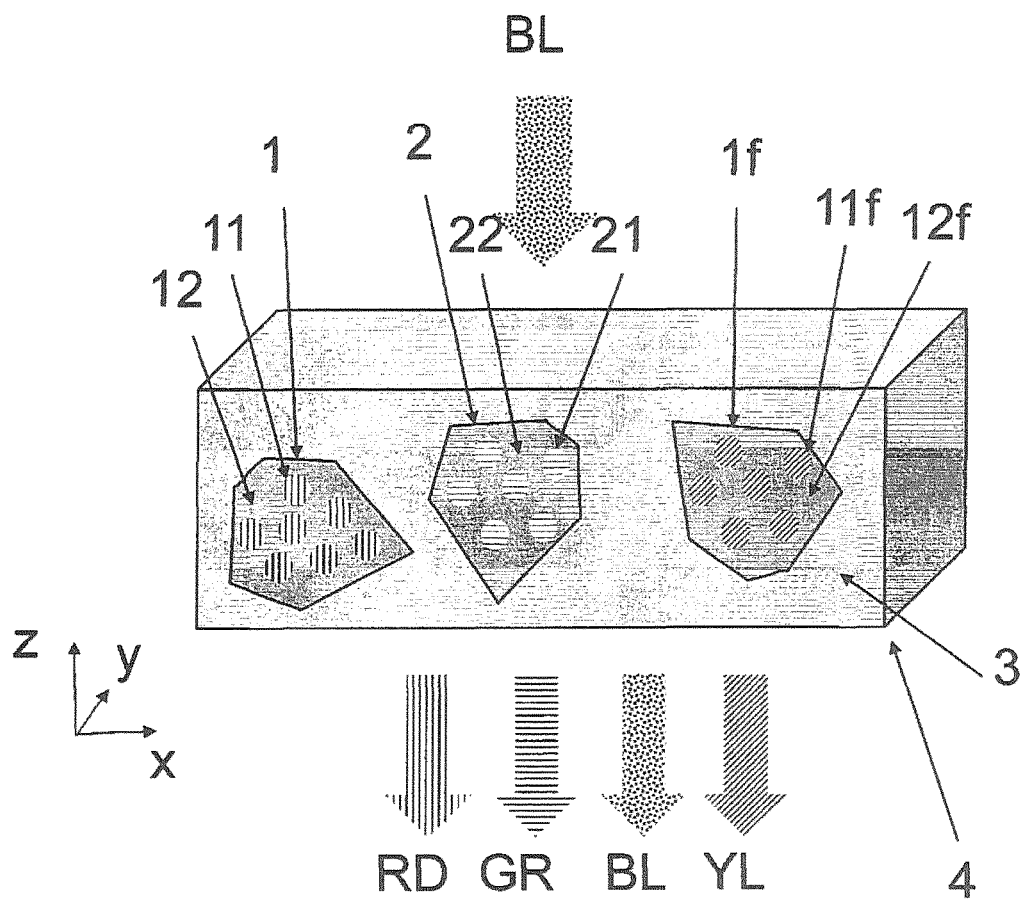
FIG. 1 illustrates a schematic perspective view of a luminescent component according to an embodiment of the present invention.

FIG. 1 illustrates a schematic perspective view of a luminescent component according to an embodiment of the present invention. The luminescent component 4 comprises an encapsulation 3, e.g. made from a non-opaque polymer. In the present embodiment, the encapsulation 3 is of a thin film shape whereby the length (x-axis) and width (y-axis) are of much greater size than the thickness in z-direction. However, the encapsulation 3 may take a different shape if needed.

First elements 1, second elements 2, and first further elements if are embedded in the encapsulation 3, only one of each is shown in a cut mode in FIG. 1.

The first element 1 comprises a first solid polymer composition including first luminescent crystals 11 but no other luminescent crystals, and a first polymer 12. The first luminescent crystals 11 are selected from compounds of formula (I) introduced above. The first luminescent crystals 11 have a size between 3 nm and 3000 nm. In response to excitation by blue light DL as indicated by the arrow, the first luminescent crystals 11 emit red light RD, for example.

The second element 2 comprises a second solid polymer composition including second luminescent crystals 21 but no other luminescent crystals, and a second polymer 22. The second luminescent crystals 21 are selected from compounds of formula (II) introduced above. The second luminescent crystals 21 have a size between 3 nm and 3000 nm. In response to excitation by the blue light BL, the second luminescent crystals 21 emit green light GR, for example.

Generally, different further elements nf with n∈[1, N] may be comprised in the encapsulation 3 including a first further element 1f, preferably a second further element 2f, . . . an Nth further element Nf. Each further element nf comprises a further solid polymer composition including further luminescent crystals n1f but no other luminescent crystals, and a further polymer n2f.

Presently, only first further elements 1f are included in the encapsulation 3. Each first further element if comprises first further luminescent crystals 11f and a first further polymer 12f. The first further luminescent crystals 11f are selected from compounds of formula (III) introduced above. The first further luminescent crystals 11f have a size between 3 nm and 3000 nm. In response to excitation by the blue light BL, the first further luminescent crystals 11f emit yellow light YL, for example.

In one embodiment of the invention there can also be multiple further elements nf emitting multiple different colors.

The first, second and further luminescent crystals 11, 21, n1f are separated from each other by means of the separated elements 1, 2, nf. In this embodiment, the encapsulation 3 builds the separation. Hence, the first, second and further luminescent elements 1, 2, nf are stable, also in a long-term.

As is indicated in FIG. 1, once such luminescent component is exposed to radiation of a shorter wavelength than the emitted wavelength, and in particular to blue radiation BL, the first, second and first further luminescent crystals 11, 21, 11f are excited and emit red, green and yellow light RD, GR, YL, respectively. Together with a portion of the blue light BL passing the luminescent component 4 the output of the luminescent component is a mixture of these colors and can be tuned by the amount of first, second and first further elements 1, 2, 11f in the luminescent component.

In case the luminescent component 4 of FIG. 1 comprises first and second elements 1 and 2 emitting red and green light only, the luminescent component 4 may in combination with a light source emitting the blue light BL represent a backlight film that can be used in an LCD given that the combination of red, green and blue light emitted result in white light. An intensity proportion of the red, green and blue light emitted preferably is in the range of a 1/3 each.

Figure 2:
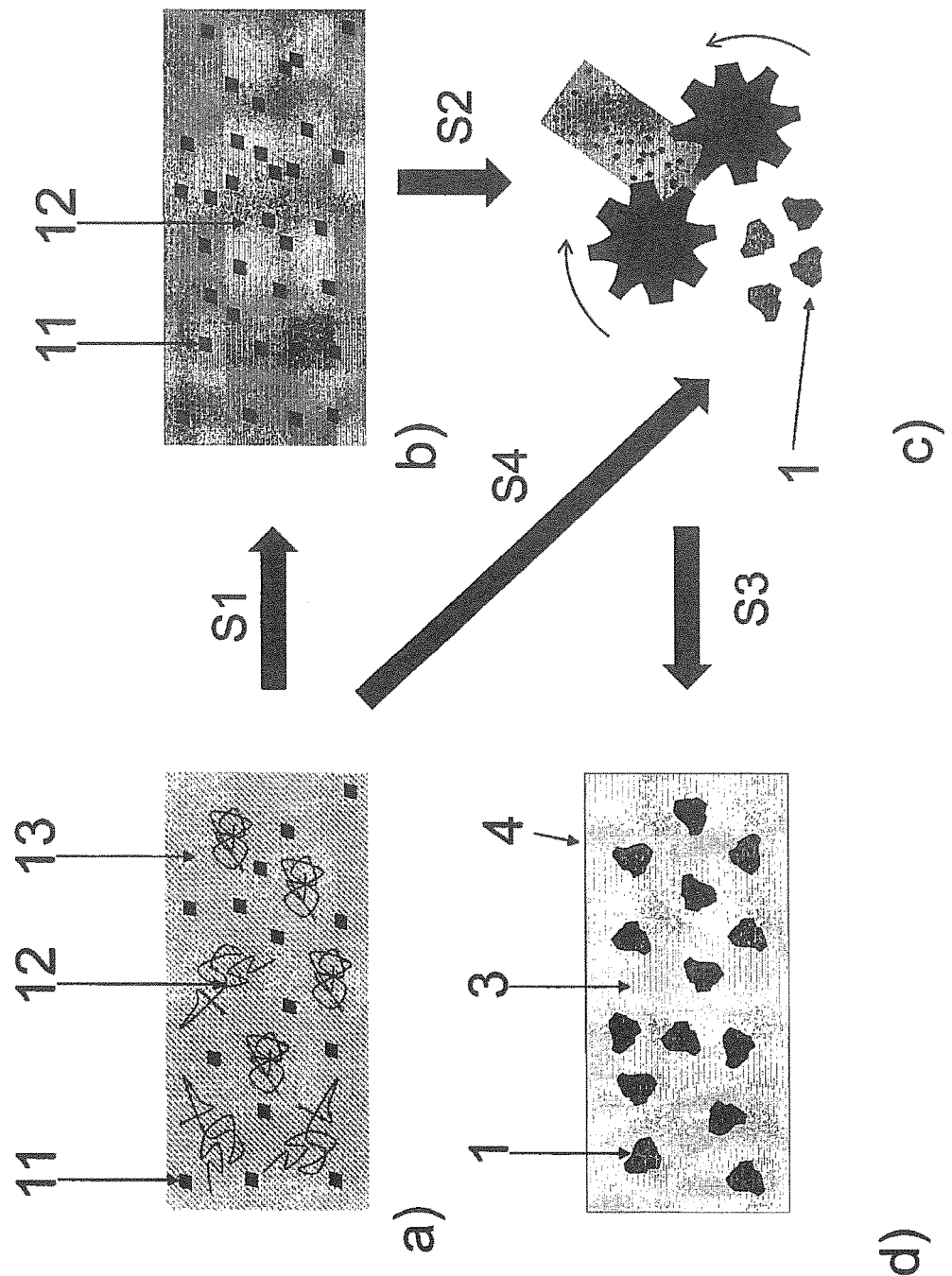
FIG. 2 illustrates a method for manufacturing a luminescent component according to an embodiment of the present invention.

FIG. 2 illustrates a method for manufacturing a luminescent component according to an embodiment of the present invention. According to diagram 2a), a first polymer solution is provided comprising first luminescent crystals 11 but no different kind of luminescent crystals, a first polymer 12 and a solvent 13. In step S1, the solution is hardened, cured or dried in order to generate a solid first polymer composition shown in diagram 2b) which includes the first luminescent crystals 11 and the first polymer 12 but no longer the solvent 13.

According to step S2, the first solid polymer composition of diagram 2b) is crushed according to diagram 2c), e.g. by milling. The result of this processing step are multiple first elements 1, each of a solid polymer composition including the first polymer and the first luminescent crystals.

In step S3, these first elements 1 are added to and/or mixed into an encapsulation polymer solution or liquid monomer or liquid oligomer. Subject to the application of the resulting luminescent component other elements configured to emit light of one or more different wavelengths than the first elements may be added to and/or mixed into the encapsulation polymer solution or liquid monomer or liquid oligomer. After hardening and/or curing and/or drying, the luminescent component 4 is generated including the encapsulation 3, and enclosed by the encapsulation 3 the multiple first elements 1.

As an alternative to steps S1 and S2, the first polymer solution of diagram 2a) may in its liquid form be processed for extracting multiple first elements 1 therefrom. For example, step S4 may represent spray-drying, or precipitation. The result of these processes again are the multiple solid first element 1.

Figure 3:
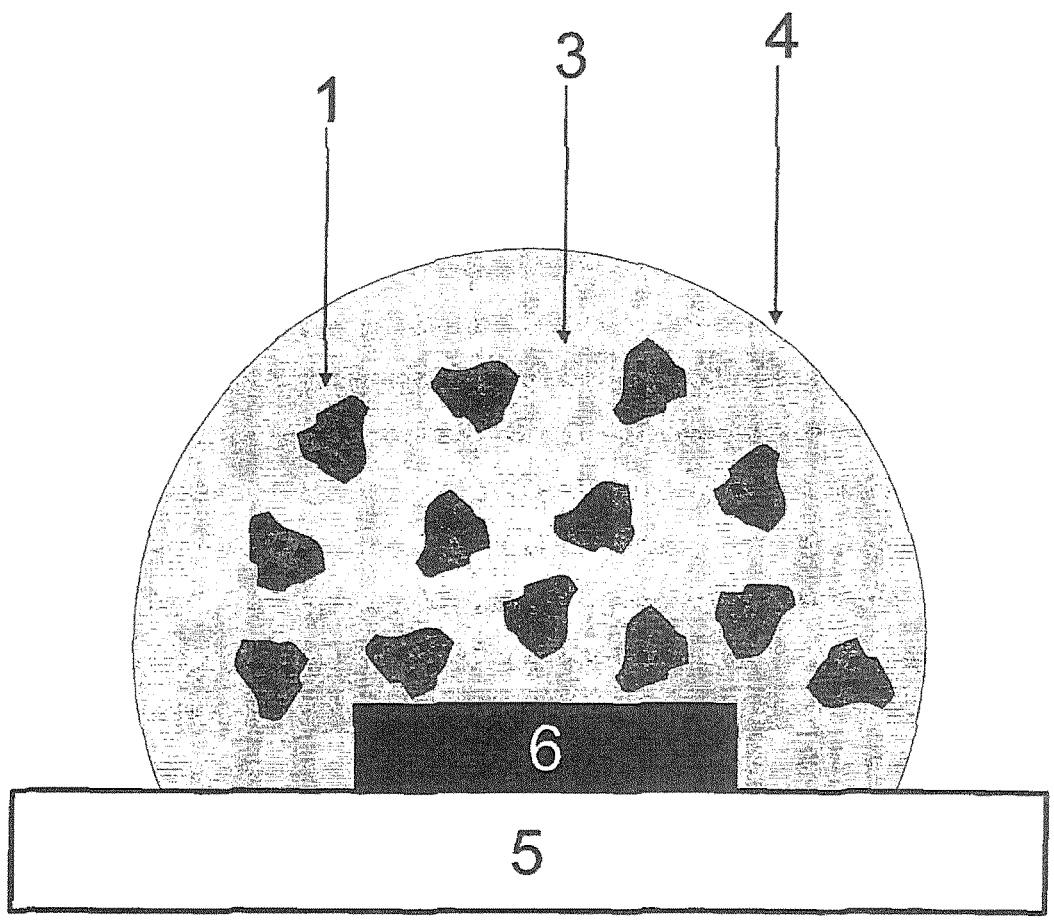
FIG. 3 illustrates a light emitting device according to an embodiment of the present invention.

FIG. 3 illustrates a light emitting device according to an embodiment of the present invention. The light emitting device presently is a Light Emitting Diode LED. The device includes a luminescent component 4 of a sphere-like shape. As is indicated in FIG. 3, the luminescent component 4 includes multiple first elements 1. Each first element 1 includes first luminescent crystals in addition to a first polymer, but no other luminescent crystals. The first elements 1 are embedded in the encapsulation 3 separate from each other, which encapsulation 3 is transmissive to light. Subject to the application of the resulting device other elements configured to emit light of one or more different wavelengths than the first elements may be incorporated in the encapsulation.

Reference numeral 6 indicates an LED chip as a light source that is arranged on a carrier 5. The luminescent component 4 partly encloses—the top and the sides of—the LED chip 6. The LED chip 6 preferably is configured to emit blue light. In response to an excitation by blue light emitted from the LED chip 6, the luminescent crystals in the first elements 1 and/or further elements of the luminescent component 4 emit light of a different colour, e.g. red, green and/or yellow light. Hence, the present embodiment schematically illustrates an LED emitting e.g. additive colour mixtures of red and/or green and/or yellow with LED chip 6 blue light light. As to the manufacturing of the device of FIG. 3, the LED chip 6 may be preassembled onto the carrier 5, and the luminescent component 4 may be dropped onto the LED chip 6/carrier 5 arrangement in liquid form, and then be hardened, cured or dried.

In view of the luminescent component 4 being arranged directly on the LED chip 6, the luminescent component 4 preferably includes heat resistant materials. For example, the first polymer in the first elements 1 and the encapsulation may be a temperature stable polymer, and preferably may be Silicone or Polysilazane.

Figure 4:
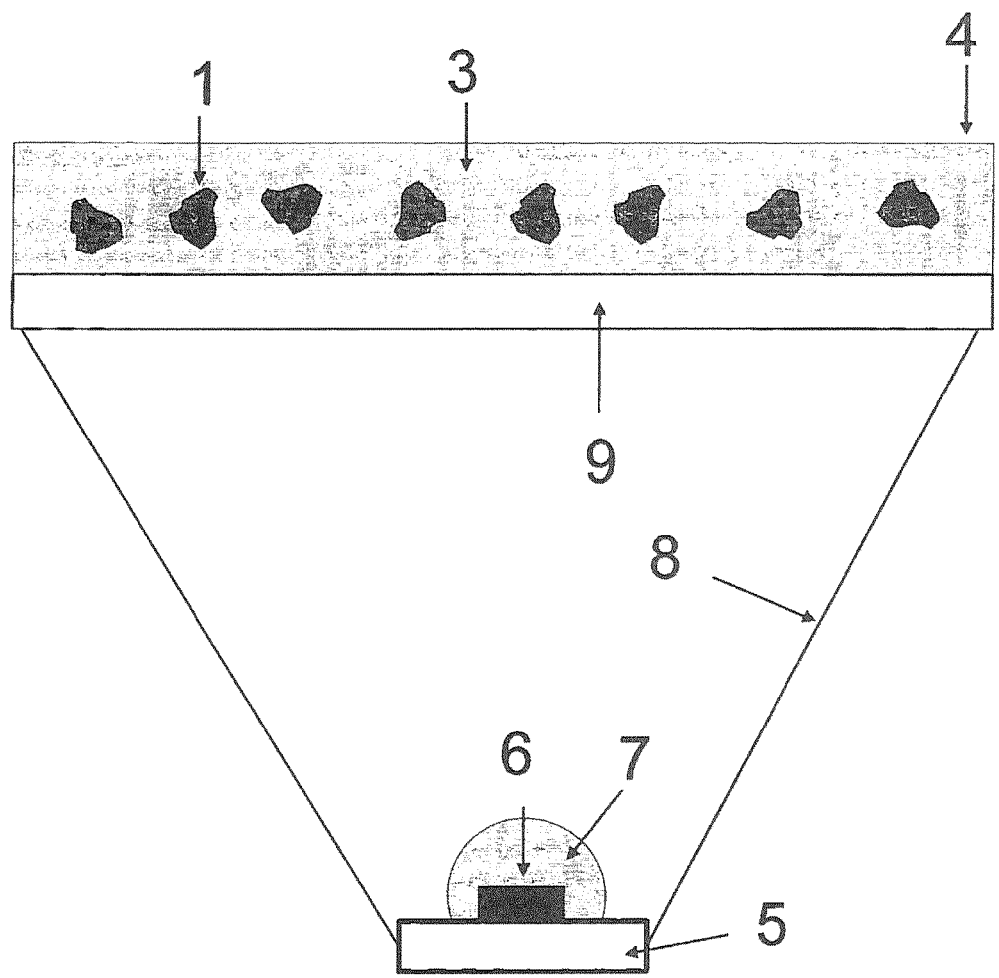
FIG. 4 illustrates a light emitting device according to another embodiment of the present invention.

FIG. 4 illustrates a light emitting device according to another embodiment of the present invention. The light emitting device presently is a Light Emitting Diode LED. The device includes a luminescent component 4 of a film-like shape. As is indicated in FIG. 4, the luminescent component 4 includes multiple first elements 1. Each first element 1 includes first luminescent crystals in addition to a first polymer but no other luminescent crystals. The first elements 1 are embedded in the encapsulation 3 separate from each other, which encapsulation 3 is transmissive to light. Subject to the application of the resulting device other elements configured to emit light of one or more different wavelengths than the first elements may be incorporated in the encapsulation.

The luminescent component 4 is arranged on a transparent plate 9, e.g. of a housing or a front. The luminescent component 4/plate 9—combination is arranged distant from an LED chip 6 acting as a light source that is arranged on a carrier 5. The distant arrangement may be achieved by means of a housing 8. The LED chip 6 preferably is configured to emit blue light. Presently, the LED chip 6 is partly enclosed by a phosphor-free enclosure 7. In response to an excitation by blue light emitted from the LED chip 6, the luminescent crystals in the first elements 1 and/or further elements of the luminescent component 4 emit light of a different colour, e.g. red, green and/or yellow light. Hence, the present embodiment schematically illustrates an LED emitting e.g. additive colour mixtures of red and/or green and/or yellow with LED chip 6 blue light. As to the manufacturing of the device of FIG. 4, the LED chip 6 may be preassembled onto the carrier 5, while the luminescent component 4 may in its hardened form be attached to the plate 9.

In contrast to the embodiment illustrated in FIG. 3, the luminescent component is arranged distant form the LED chip 6 such that the luminescent component may not be required to stand heat in the same way.

Figure 5:
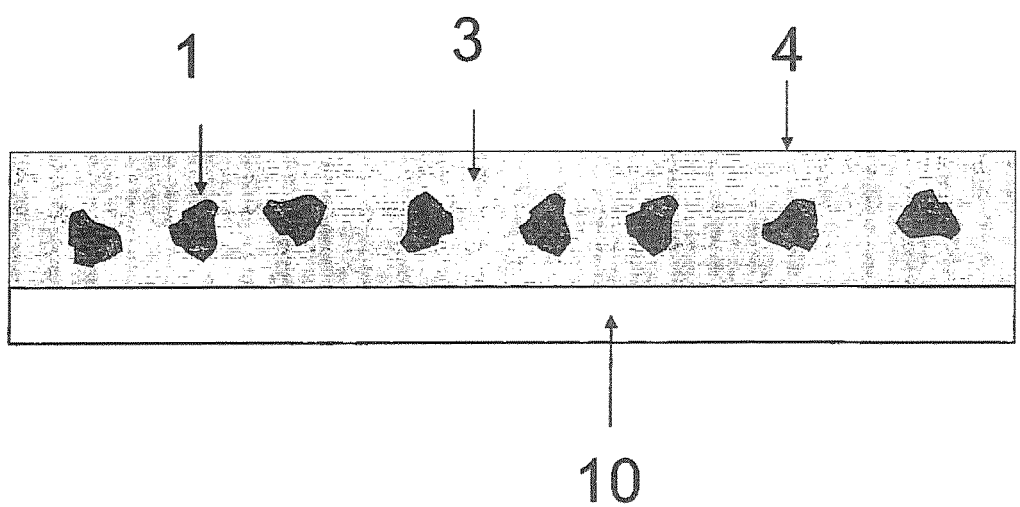
FIG. 5 illustrates a light emitting device according to another embodiment of the present invention.

FIG. 5 illustrates a light emitting device according to an embodiment of the present invention. The light emitting device presently is an Organic Light Emitting Diode OLED. The device includes a luminescent component 4 of flat shape. As is indicated in FIG. 5, the luminescent component 4 includes multiple first elements 1. Each first element 1 includes first luminescent crystals in addition to a first polymer, but no other luminescent crystals. The first elements 1 are embedded in the encapsulation 3 separate from each other, which encapsulation 3 is transmissive to light. Subject to the application of the resulting device other elements configured to emit light of one or more different wavelengths than the first elements may be incorporated in the encapsulation.

Reference numeral 10 indicates an OLED stack as a light source that may be arranged on further carrier. The OLED stack 10 preferably is configured to emit blue light. In response to an excitation by blue light emitted from the OLED stack 10, the luminescent crystals in the first elements 1 and/or further elements of the luminescent component 4 emit light of a different colour, e.g. red, green and/or yellow light. Hence, the present embodiment schematically illustrates an OLED device emitting e.g. additive colour mixtures of red and/or green and/or yellow with LED chip 6 blue light. As to the manufacturing of the device of FIG. 5, the OLED stack 10 may be preassembled onto a carrier, and the luminescent component 4 may be coated onto the OLED stack 10 in liquid form, and then be hardened, cured or dried.

EXAMPLES AND EXPERIMENTS

Example 1

Luminescent crystals emitting red light were produced as described by Protesescu et al. (Nano Lett., 2015, 15, 3692-3696). The resulting solids load was measured to be 0.06 wt % by heating up to 450° C. and thus evaporating the solvent and burning away the ligands. The optical properties of the resulting nanocrystal formulation were measured with a Hamamatsu Quantaurus C11347-11 device (equipped with an integrating sphere) and a quantum yield of 72% at an emission peak wavelength of 638 nm with a FWHM of 33 nm were achieved.

33 wt % of this formulation were mixed with 67 wt % of previously prepared solution of 30 wt % PMMA (Plexiglas 7N) in toluene and immediately poured onto a glass substrate which was heated to 60° C. After complete drying (12 h) at 60° C. a luminescent, transparent foil of approximately 1 mm thickness was obtained. The foil showed the following optical properties: Quantum yield 70%, emission peak wavelength 641 nm, FWHM 31 nm.

This foil was then cut into pieces of approximately 1 cm×1 cm size, cooled down to −196° C. with liquid nitrogen. The foil was subsequently pulverized with a commercially available coffee grinder. The obtained luminescent polymer particle size was estimated to be in the range of a few 100 µm. The obtained powder showed the following optical properties: Quantum yield 69%, emission peak wavelength 640 nm, FWHM 32 nm.

33 wt % of the hereby obtained powder was mixed with 67 wt % of Electrolube SC3001 silicone resin (resin:hardener 13.5:1) coated onto a glass substrate and cured at 60° C. for 2 hours. The resulting film was approximately 1-2 mm thick and showed the following optical properties: Quantum yield 69%, emission peak wavelength 638 nm, FWHM 32 nm. Based on the measured solids load of the starting formulation the film had a Pb concentration of approximately 60 ppm.

Example 2

Luminescent crystals emitting green light were produced as described by Protesescu et al. (Nano Lett., 2015, 15, 3692-3696). The resulting solids load was measured to be 0.54 wt % by heating up to 450° C. and thus evaporating the solvent and burning away the ligands. The optical properties of the resulting nanocrystal formulation were measured with a Hamamatsu Quantaurus C11347-11 device (equipped with an integration sphere) and a quantum yield of 89% at an emission peak wavelength of 500 nm with a FWHM of 23 nm were achieved.

11 wt % of this formulation were mixed with 89 wt % of a previously prepared solution of 25 wt % Polystyrene (Sigma Al-drich) in toluene and subsequently processed analogously to example 1 to receive a green luminescent polymer powder with the following optical properties: Quantum yield 66%, emission peak wavelength 518 nm, FWHM 28 nm According to example 1 33 wt % of the hereby obtained powder was mixed with 67 wt % of Electrolube SC3001 silicone resin (resin:hardener 13.5:1) coated onto a glass substrate and cured at 60° C. for 2 hours. The resulting film was approximately 1-2 mm thick and showed the following optical properties: Quantum yield 45%, emission peak wavelength 514 nm, FWHM 30 nm. Based on the measured solids load of the starting formulation the film had a Pb concentration of approximately 400 ppm.

Example 3

The red and green luminescent polymer powder—previously also referred to as first and second elements—obtained in example 1 and 2 were mixed at 1:1 weight ratio, and 33 wt % of the mixture was mixed with 67 wt % of Electrolube SC3001 silicone resin (resin:hardener 13.5:1) coated onto a glass substrate and cured at 60° C. for 2 hours. The resulting film was approximately 1-2 mm thick and showed the following optical properties: Quantum yield 57% (measured with the same device as in example 1), emission peak wavelengths 514 nm and 638 nm, FWHM 30 nm and 32 nm, respectively. Based on the measured solids load of the starting formulations the film had a Pb concentration of approximately 230 ppm.

Accordingly the red and green luminescent polymer powder obtained in example 1 and 2 were mixed at 1:2 weight ratio, and 33 wt % of the mixture was mixed with 67 wt % of Electrolube SC3001 silicone resin (resin:hardener 13.5:1) coated onto a glass substrate and cured at 60° C. for 2 hours. The resulting film was approximately 1-2 mm thick and showed the following optical properties: Quantum yield 55%, emission peak wavelengths 513 nm and 638 nm, FWHM 30 nm and 32 nm, respectively. This result shows that a mixture of the red and green polymer powder does neither result in a degradation of the particle (shifting of emission peak wavelengths) nor a loss in performance. Based on the measured solids load of the starting formulations the film had a Pb concentration of approximately 290 ppm.

Experiment 4

Luminescent crystals emitting green and red light were produced as described by Protesescu et al. (Nano Lett., 2015, 15, 3692-3696). The resulting solids load was measured to be 0.52 wt % for green and 0.53 wt % for red, by heating up to 450° C. and thus evaporating the solvent and burning away the ligands. The optical properties of the resulting nanocrystal formulation were measured with a Hamamatsu Quantaurus C11347-11 device (equipped with an integration sphere, 45 nm excitation) and a quantum yield of 60% at an emission peak wavelength of 528 nm with a FWHM of 25 nm for green and a quantum yield of 90% at an emission peak wavelength of 645 nm with a FWHM of 38 nm for red were achieved.

These nanocrystal formulations were mix with a cyclic olefin copolymer (TOPAS 5013S-04) solution in toluene (20 wt % polymer in solvent) to yield a polymer:nanocrystal ratio of 20:1 and subsequently diluted with toluene to a final polymer content in the formulation of 4 wt %. Spray drying in an inert loop (nitrogen) of the green and red polymer solution was used to obtain a powder exhibiting a particle size of 1-20 µm as confirmed by scanning electron microscopy. The green powder showed a quantum yield of 45%, peak position of 527 nm, and FWHM of 24 nm whereas the red powder showed a quantum yield of 80%, peak position of 647 nm, and FWHM of 36 nm.

0.075 g of the green and 0.025 g of the red powder were mixed with an epoxy resin (Eposun, 2.66 g resin and 1.33 g standard hardener) in a speed mixer and the resulting mixture was cured between two glass slides for 24 h at ambient condition. This film sample showed a total quantum yield of 69%, a peak at 528 nm with FWHM of 24 nm and a peak at 648 nm with FWHM of 37 nm.

Experiment 5

The sample in experiment 4 was compared to commercially available QD films containing InP and CdSe quantum dots. Table 1 shows the optical performance of the film as measured with a Hamamatsu Quantaurus C11347-11 device (equipped with an integrating sphere). The performance, indicated as quantum yield, of the current CsPbX3 QD samples is similar to the CdSe containing commercial film 1 while showing a higher quantum yield and decreased FWHM compared to InP containing commercial film 2.

TABLE 1

| Sample | Quantum dot | Total quantum yield (%) | Peak position green (nm) | FWHM green (nm) | Peak position red (nm) | FWHM red (nm) |
|---|---|---|---|---|---|---|
| this invention | exp.4 | 69 | 528 | 24 | 645 | 37 |
| Commercial film 1 | CdSe based | 77 | 543 | 34 | 607 | 40 |
| Commercial film 2 | InP based | 59 | 531 | 41 | 632 | 56 | film 1, QD film taken from tablet Kindle Fire HDX 7 manufactured by Amazon, not compliant with RoHS, comparable quantum yield and FWHM.

film 2, QD film taken from TV model UE48JS8580 manufactured by Samsung; RoHS compliant but low quantum yield, broad FWHM.

Experiment 6 (Comparative Experiment)

The green and red luminescent formulations of example 1 and 2 were mixed together in dry weight ratios of red:green 1:1 (9:1 in formulation weight). Due to the ion exchange reaction the resulting formulation became orange with a low intensity yellow luminescence. The formulation was measured and showed the following optical properties: Quantum yield 9.5% (measured with the same device as in example 1), emission peak wavelength 554 nm, FWHM 28 nm.

This experiment clearly demonstrates that red and green LC's cannot be combined in the same liquid formulations nor in the same polymer matrix without substantially affecting the optical properties.

Experiment 7 (Comparative Experiment)

The green and red luminescent formulations containing dissolved polymer from example 1 and 2 were mixed at a weight ratio of 1:1. The resulting mixture changed its color from initial orange to yellow with green emission within a few seconds, thus indicating the ongoing ion exchange. The resulting mixture was cast onto a glass slide and dried at 60° C. The resulting film was approximately 100 μm thick and showed the following optical properties: Quantum yield 45% (measured with the same device as in example 1), emission peak wavelength 520 nm, FWHM 27 nm. The fact that no red emission peak could be detected anymore reinforces the fact that red and green emitting particles cannot be mixed within one polymer phase.

The invention claimed is:

1. A luminescent component, comprising:
a first element comprising a first solid polymer composition, wherein the first solid polymer composition comprises first luminescent crystals and a first polymer, wherein the first luminescent crystals
have a perovskite structure,
are selected from compounds of formula (I):

$M^1$ represents Cs doped with up to 30 mol % of one or more other metals having coordination number 12,
$M^2$ represents Pb or Pb doped with up to 30 mol % of one or more other metals having coordination number 6,
X represents anions independently selected from the group consisting of Cl, Br, I, cyanide, and thiocyanate,
a represents 1,
b represents 1,
c represents 3;
are of size between 3 nm and 3000 nm,
emit light of a first wavelength in response to excitation by light with a wavelength shorter than the first wavelength,
wherein the first polymer is a cyclic olefin copolymer,
an encapsulation enclosing the first element,
wherein the encapsulation comprises an encapsulation polymer or an inorganic matrix.

2. The luminescent component according to claim 1, wherein the first solid polymer composition comprises the first polymer, and
wherein the first polymer is not dissolvable in the encapsulation polymer, and vice versa.

3. The luminescent component according to claim 1, further comprising a second element comprising a second solid polymer composition, wherein the second solid polymer composition comprises second luminescent crystals, wherein the second luminescent crystals
have a perovskite structure
are selected from compounds of formula (I):

$M^1$ represents Cs doped with up to 30 mol % of one or more other metals having coordination number 12,
$M^2$ represents Pb or Pb doped with up to 30 mol % of one or more other metals having coordination number 6,
X represents anions independently selected from the group consisting of Cl, Br, and I, cyanide, and thiocyanate,
a represents 1,
b represents 1,
c represents 3;
are of size between 3 nm and 3000 nm,
are of a different chemical composition and/or a different size than the first luminescent crystals,
emit light of a second wavelength different from the first wavelength emitted by the first luminescent crystals in response to excitation by light with a wavelength shorter than each of the first and second wavelength,
wherein the encapsulation encloses the second element.

4. The luminescent component according to claim 3,
wherein the second solid polymer composition comprises a second polymer, and
wherein the second polymer is not dissolvable in the encapsulation polymer, and vice versa.

5. The luminescent component according to claim 3,
wherein the first element and the second element are arranged spaced within the encapsulation.

6. The luminescent component according to claim 5, wherein the first polymer and the second polymer are identical.

7. The luminescent component according to claim 3, further comprising
N further elements (nf) with N>=1,
each further element (nf) comprising a further solid polymer composition and further luminescent crystals (n1f), wherein the further luminescent crystals (n1f)
have a perovskite structure
are selected from compounds of formula (I):

(I), wherein $M^1$ represents Cs doped with up to 30 mol % of one or more other metals having coordination number 12,
$M^2$ represents Pb or Pb doped with up to 30 mol % of one or more other metals having coordination number 6,
X represents anions independently selected from the group consisting of Cl, Br, and I, cyanide, and thiocyanate,
a represents 1,
b represents 1,
c represents 3;
are of size between 3 nm and 3000 nm,
are of a different chemical composition and/or a different size than the first luminescent crystals, second luminescent crystals and any of the other further luminescent crystals (n1f),
emit light of a further wavelength in response to excitation by light with a wavelength shorter than the further wavelength, wherein the further wavelength is different from the first wavelength emitted by the first luminescent crystals, is different from the second wavelength emitted by the second luminescent crystals, and is different from any other further wavelengths emitted by the further luminescent crystals (n1f), wherein each further solid polymer composition optionally comprises a further polymer (n2f), and wherein the further polymer (n2f) is not dissolvable in the encapsulation polymer, and vice versa.

8. The luminescent component according to claim 7,
wherein the encapsulation polymer is selected from the list of acrylate polymers, carbonate polymers, sulfone polymers, epoxy polymers, vinyl polymers, urethane polymers, ester polymers, styrene polymers, silicone polymers, olefin polymers and cyclic olefin copolymers and
wherein the second polymer, and further polymer (n2f) are independently selected from the group of polyacrylates, including co-polymers, polystyrenes, silicones, and cyclic olefin copolymers.

9. The luminescent component according to claim 8, wherein the encapsulation polymer has a water vapor transmission rate of less than 0.2 g mm m$^{-2}$ day$^{-1}$.

10. The luminescent component according to claim 7,
wherein the first luminescent crystals, the second luminescent crystals, and further luminescent crystals (n1f) independently are of size between 5 nm and 100 nm, and/or
wherein a mean diameter of the first elements, second element, and further elements (nf) independently are between 1 µm and 500 µm.

11. The luminescent component according to claim 7,
wherein N is in the range of 3 to 28.

12. The luminescent component according to claim 7,
wherein the first element comprises the first luminescent crystals only and is free from any other luminescent crystals,
wherein the second element comprises the second luminescent crystals only and is free from any other luminescent crystals
wherein each of the further elements comprises the further luminescent crystals (n1f) only and is free from any other luminescent crystals.

13. The luminescent component according to claim 7,
wherein the first luminescent crystals, the second luminescent crystals if present, and any luminescent crystals (n1f) if present independently are of size between 5 nm and 100 nm, and/or
wherein a mean diameter of the first elements, second elements if present, and any further elements (nf) if present independently is between 5 µm and 100 µm.

14. The luminescent component according to claim 7, wherein the first, second and further luminescent crystals each comprise compounds of formula (I) wherein $M^1$ is selected from the group consisting of Rb, K, Na and Li.

15. The luminescent component according to claim 7,
wherein the luminescent component contains a total concentration of lead (Pb)<1000 ppm by weight; a total concentration of mercury (Hg)<1000 ppm; a total concentration of cadmium (Cd)<100 ppm; a total concentration of hexavalent chromium (Cr$^{6+}$)<1000 ppm; a total concentration of polybrominated biphenyls (PBB)<1000 ppm; and a total concentration of polybrominated diphenyl ether (PBDE)<1000 ppm.

16. The luminescent component according to claim 3,
wherein the first luminescent crystals are selected from the group consisting of:
CsPbBr$_x$I$_{3-x}$, whereby 0≤x<2; and
CsPbCl$_y$Br$_{3-y-z}$I$_z$, where 0<y<1, 2≤z≤3-y, and
wherein the second luminescent crystals are selected from the group consisting of:
CsPbBr$_x$I$_{3-x}$, where 2≤x≤3; and
CsPbCl$_y$Br$_z$I$_{3-y-z}$, where 0<y<1, 1<z≤3-y.

17. The luminescent component according to claim 3,
wherein the first and second luminescent crystals each comprise compounds of formula (I) wherein $M^1$ is selected from the group consisting of Rb, K, Na and Li.

18. The luminescent component according to claim 3,
wherein the luminescent component contains a total concentration of lead (Pb)<1000 ppm by weight; a total concentration of mercury (Hg)<1000 ppm; a total concentration of cadmium (Cd)<100 ppm; a total concentration of hexavalent chromium (Cr$^{6+}$)<1000 ppm; a total concentration of polybrominated biphenyls (PBB)<1000 ppm; and a total concentration of polybrominated diphenyl ether (PBDE)<1000 ppm.

19. A light emitting device, comprising
a luminescent component according to claim 1,
a light source for emitting blue light,
wherein the light source is arranged for exciting the luminescent component with a wavelength shorter than the first wavelength, and
wherein the light emitting device is one of an LCD display, an OLED display, a Light Emitting Diode (LED) or an Organic Light Emitting Diode (OLED).

20. The light emitting device according to claim 19, wherein the light source is an LED chip, and
wherein the luminescent component is arranged distant from the LED chip.

21. The luminescent component according to claim 20, wherein the LED chip is at least partly covered by a phosphor-free enclosure.

22. The luminescent component according to claim 1, wherein the first luminescent crystals comprise compounds of formula (I) wherein $M^1$ is selected from the group consisting of Rb, K, Na and Li.

23. The luminescent component according to claim 1, wherein the luminescent component contains a total concentration of lead (Pb)<1000 ppm by weight; a total concentration of mercury (Hg)<1000 ppm; a total concentration of cadmium (Cd)<100 ppm; a total concentration of hexavalent chromium ($Cr^{6+}$)<1000 ppm; a total concentration of polybrominated biphenyls (PBB)<1000 ppm; and a total concentration of polybrominated diphenyl ether (PBDE)<1000 ppm.

* * * * *